(12) United States Patent
Popescu et al.

(10) Patent No.: US 10,823,793 B2
(45) Date of Patent: Nov. 3, 2020

(54) RESONANCE DATA ACQUISITION SCANNER WITH ROTATING BASIC FIELD MAGNET

(71) Applicants: Siemens Healthcare GmbH, Erlangen (DE); Yale University, New Haven, CT (US)

(72) Inventors: Stefan Popescu, Erlangen (DE); Markus Vester, Nuremberg (DE); Peter Speier, Erlangen (DE); Edgar Müller, Heroldsbach (DE); Robert Todd Constable, Madison, CT (US); Gigi Galiana, New Haven, CT (US)

(73) Assignees: Siemens Healthcare GmbH, Erlangen (DE); Yale University, New Haven, CT (US)

( * ) Notice: Subject to any disclaimer, the term of this patent is extended or adjusted under 35 U.S.C. 154(b) by 14 days.

(21) Appl. No.: 16/366,848

(22) Filed: Mar. 27, 2019

(65) Prior Publication Data
US 2020/0309878 A1    Oct. 1, 2020

(51) Int. Cl.
*G01R 33/38* (2006.01)
*G01R 33/381* (2006.01)
*G01R 33/383* (2006.01)

(52) U.S. Cl.
CPC ....... *G01R 33/3802* (2013.01); *G01R 33/381* (2013.01); *G01R 33/383* (2013.01); *G01R 33/3806* (2013.01)

(58) Field of Classification Search
CPC ............ G01R 33/3802; G01R 33/3806; G01R 33/383; G01R 33/307; G01R 33/381
See application file for complete search history.

(56) References Cited

U.S. PATENT DOCUMENTS

| 5,779,637 A * | 7/1998 | Palkovich ........ G01R 33/3806 324/318 |
| 2004/0066194 A1 | 4/2004 | Slade et al. |
| 2017/0038451 A1* | 2/2017 | Ristic ................. G01R 33/3806 |

FOREIGN PATENT DOCUMENTS

WO    2018106760 A1    6/2018

* cited by examiner

*Primary Examiner* — Susan S Lee
(74) *Attorney, Agent, or Firm* — Schiff Hardin LLP

(57) ABSTRACT

A magnetic resonance scanner has a base, a C-arm mounted on the base, the C-arm having an inner surface curved in a C-shape, the C-shape defining a plane, a magnet mounted on the inner curved surface of the C-arm, the magnet generating a basic magnetic field for magnetic resonance imaging, and a drive mechanism mechanically connected to the magnet. The drive mechanism rotates the magnet around an axis that is orthogonal to the plane so as to selectively position the magnet in at least two magnet positions that are respectively above and beneath a patient, who is situated in the C-arm along or parallel to the axis.

27 Claims, 6 Drawing Sheets

RESONANCE DATA ACQUISITION SCANNER WITH ROTATING BASIC FIELD MAGNET

BACKGROUND OF THE INVENTION

Field of the Invention

The present invention concerns methods and apparatuses for magnetic resonance imaging (MRI), and in particular concerns a method and an MR data acquisition scanner of the type known as an "open" system.

Description of the Prior Art

Magnetic resonance imaging (MRI) is a known modality for obtaining an image of the interior of an examination object. MRI has become a commonly used imaging modality in the field of medicine, wherein the examination object is a patient. An MR image has the advantage of being able to show anatomical details and physiological processes inside of the patient that often cannot be seen in images produced by other imaging modalities, such as conventional x-ray, computed tomography (CT) and ultrasound.

In an MR system, the patient is moved into a device known as a scanner or imager, which has a patient-receiving space or volume therein, in which the patient must be placed in order to achieve the best image quality. The patient in this imaging volume is exposed to a strong and homogeneous basic magnetic field, preferably having a field strength of at least 1.5T. This basic magnetic field aligns the nuclear spins of atoms within the patient along the field lines of the basic magnetic field. The patient, or a specific volume within the patient, is then exposed to a controlled emission, from a radio-frequency (RF) antenna, of RF energy, which gives certain nuclear spins in the patient a magnetization that causes those excited nuclear spins to be deflected from the aforementioned alignment, by an amount known as a "flip angle." As these excited nuclear spins relax and return to their aligned position, they emit RF signals known as MR signals. Gradient coils are used in the scanner in order to spatially encode these MR signals, so that the location in the patient from which the MR signals originated can be determined.

The MR data acquired in this manner are known as raw data, and are entered as complex numbers into a memory. The raw data in this memory can be transformed in a known manner into image data, which represent an image of at least a part of the patient. The image data can be archived as a data file or displayed at a display screen.

Two basic structural configurations of MR scanners are known. A first type is a so-called "open" system in which the basic magnetic field is generated by two magnets, usually permanent magnets or electromagnets, which are respectively positioned above and below the patient on the patient table. These two magnets are connected to each other by a stationary frame called a yoke.

Another type of MR scanner is a so-called "closed" scanner, in which the patient on the patient table is moved into a bore or tunnel, which is completely circumferentially closed and surrounds the patient therein. The basic field magnet in such a closed system is formed by coils that also surround the subject. The coils in such a closed system usually have superconducting conductors, which are maintained in a cryogenic environment, so that a much stronger magnetic field can be produced in such a closed system, compared to an open system. In general, the stronger and more homogenous that the basic magnetic field is, the better the quality of the MR image.

A drawback with regard to patient comfort in the use of such a closed system is that many patients experience certain levels of claustrophobia in the completely closed environment of the tunnel. In an open system, by contrast, no part of the patient is completely enclosed by the basic field magnet and, most importantly for patients who experience serious claustrophobia, the head of the patient is not enclosed by any structure of the scanner.

Some patients experience claustrophobia to such a significant degree that those patients cannot be examined in a closed MR system, thereby preventing the physicians treating such patients from being able to take advantage of the higher quality imaging that is achieved by such closed systems. Additionally, many clinics and hospitals have only closed MR scanners, and do not have an open MR scanner installed on site, so the option of examining a claustrophobic patient with an open MR scanner is not even available. A recent study has shown that approximately 1% to 15% of all potential MRI patients suffer from claustrophobia-related anxiety, and so either cannot be examined with a closed MRI scanner, or require sedation in order to implement the scan. The study also showed that approximately 25% of women who refused to take part in an MRI study of women at high risk of breast cancer cited claustrophobia as the reason. With approximately 80 million MRI procedures being performed annually worldwide, these percentages means that roughly 2 million potential MR examinations cannot be implemented, because of claustrophobia-related reasons.

One known approach to addressing this problem is to increase the diameter of the tunnel in a closed MR scanner, so that the claustrophobia experienced by patients therein is at least reduced to a certain extent. Such large bore scanners, however, because of their increased size, and in particular the increased size of the superconducting magnets and the cryogenic container (cryostat) thereof, make such large bore scanners extremely expensive. Unilateral or patient table-top MR scanner architectures also have been suggested, as described, for example, in United States Patent Application Publication No. 2004/0066194.

Moreover, as the size of the patient-receiving receptacle increases in such scanners, this necessarily means that the static magnetic field intensity decreases with increasing distance from the basic field magnet. The strength of the basic field magnet is decisive for the signal-to-noise ratio (SNR) of the received signal, and therefore such decreasing strength results in the SNR also decreasing with increasing distance from the magnet. Simulations as shown in FIG. 1 show how the overall strength of the non-homogenous image quality is distributed across the imaging volume. FIG. 1 shows the SNR distribution in three-dimensions that occurs for various field strengths.

A magnetic resonance imaging apparatus, and a method for operating such an apparatus, are known from published PCT application WO 2018/106760 A1, to use an electromagnet, as the basic field magnet, with an open geometry, and to generate a spatially non-uniform magnetic field within an imaging region of the apparatus. It is known to control the current through the electromagnet so as to repeatedly cycle the non-uniform magnetic field between a high strength, for polarizing nuclear spins, and a low strength, for spatially encoding and readout of the MR signals. The electromagnet is thus able to perform the spatial encoding function of conventional gradient coils, so that gradient coils are not needed in that apparatus.

SUMMARY OF THE INVENTION

An object of the present invention is to provide a structural arrangement of an MR data acquisition scanner that alleviates claustrophobic anxiety on the part of the patient, which still allows MR signals to be acquired with a good signal-to-noise ratio, so that the quality of the reconstructed MR image is not impaired.

This object is achieved in accordance with the present invention by an MR scanner having a C-arm on which the basic field magnet is mounted. The basic field magnet is mounted or a C-arm so as to be rotatable around the patient, so that the basic field magnet can be positioned at multiple angle locations (i.e., at least two magnet angle positions) relative to the patient. These multiple magnet angle locations are respectively above and below the patient, and can be, or include, two magnet angle positions that are 180° opposite each other. The rotation of the basic field magnet can occur by the basic field magnet being moved along the inner curved surface of the C-arm, or the basic field magnet can be stationarily mounted on the C-arm, with the C-arm being rotated so that the basic field magnet rotates with the C-arm.

The above object also is achieved In accordance with the present invention by an MR imaging apparatus wherein the MR scanner according to the invention is operated by a control computer so as to acquire MR data from the patient in two scans, with the magnet situated in at least one of the aforementioned positions in one of the scans and situated in at least one of the other of the aforementioned positions during the other scan. An image is reconstructed from the MR data acquired in each of these scans, and the two images are brought into registration with each other and combined by a suitable technique, such as a Sum-of-Squares (SoS) technique.

The present invention also encompasses a method for generating an MR image of a patient in the manner described above.

Because the patient is situated in the C-arm, which extends only around the portion of the patient from which the MR data are being acquired, in many scans the patient's head and face will not be covered or enclosed by the MR scanner, thereby alleviating claustrophobic anxiety that is caused when the patient can see and therefore sense that the patient is completely enclosed. Even when conducting head examinations, the C-arm represents a much less intrusive enclosure to the patient.

By also adjusting the height of the patient table on which the patient is lying inside of the C-arm, the distance between the patient and the basic field magnet can be selectively adjusted when the magnet is in each of the two positions, thereby still allowing the MR signals to be received with a good SNR. The field of view (FOV) from which MR data can be reliably acquired is also enlarged.

DESCRIPTION OF THE PREFERRED EMBODIMENTS

Figure 1:
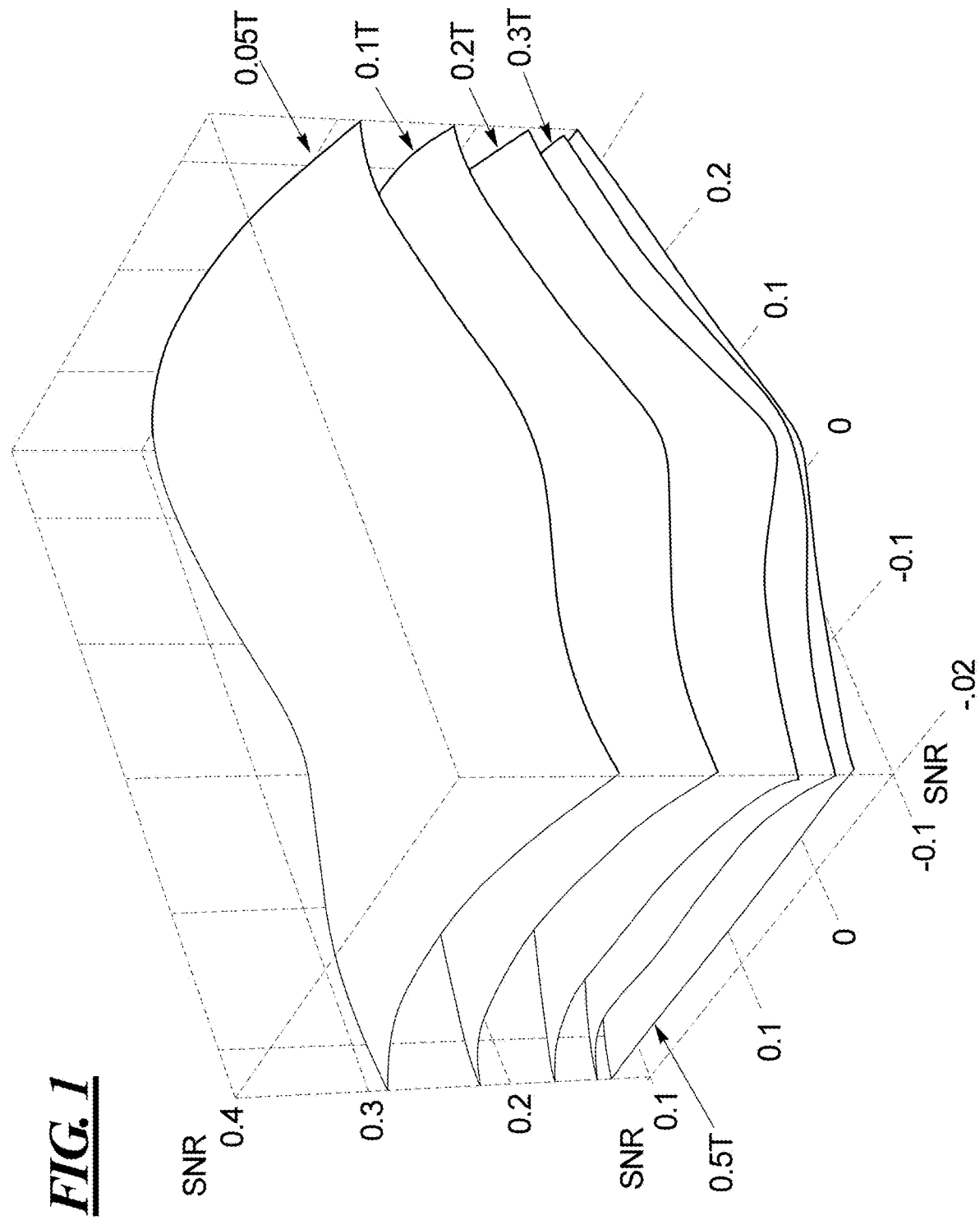
FIG. 1 is a graph showing the three-dimensional SNR distribution of MR signals acquired with different basic magnetic field strengths.
Figures 2, 3:
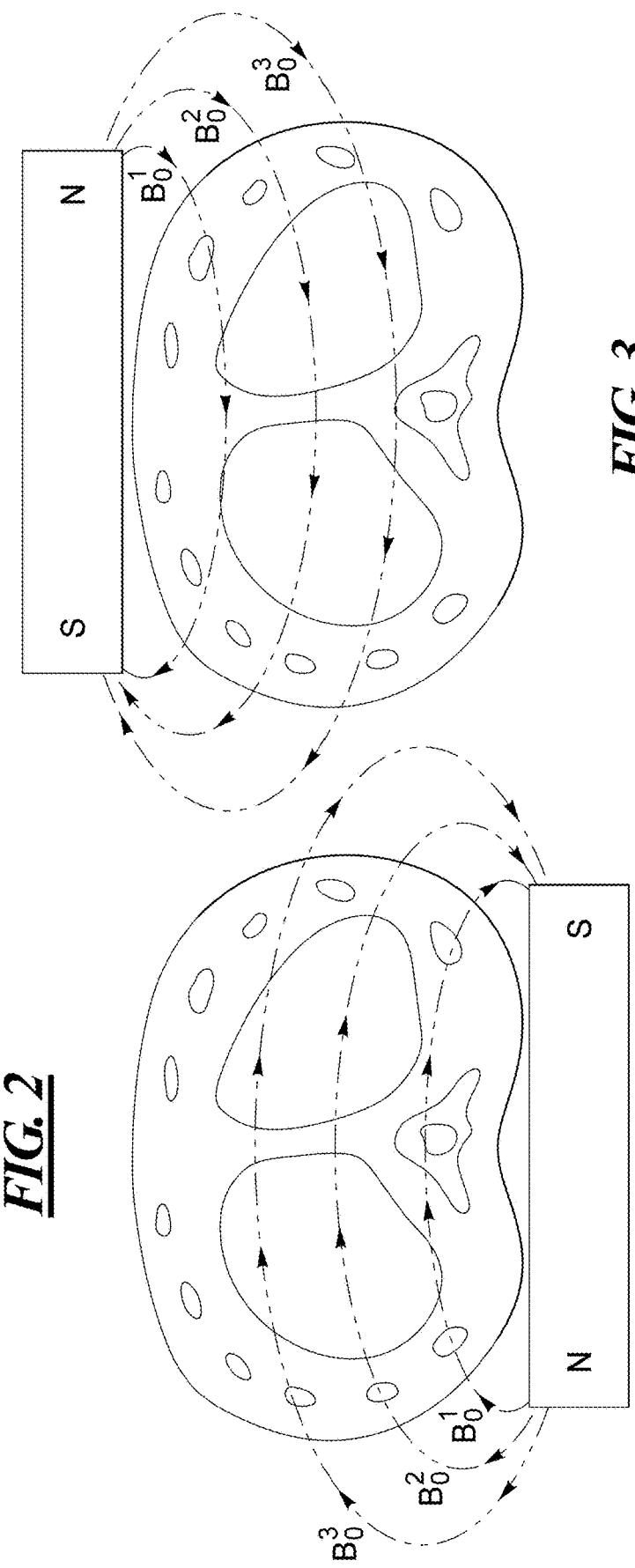
FIGS. 2 and 3 show the field strength lines of the basic magnetic field generated by the basic magnetic field in respective positions above and below the patient.

FIGS. 2 and 3 illustrate the basic concept of the MR scanner according to the invention, by showing the basic field magnet in respective positions above and below a cross-section of a patient's torso. The basic field magnet can be a permanent magnet, but is preferably an electromagnet, so that the polarity thereof can be selectively changed, as is the case between FIG. 2 and FIG. 3.

As can be seen in FIGS. 2 and 3, the basic field magnet produces a basic magnetic field in the torso, with field strengths at the respective fields lines designated as $B_0^3$, $B_0^2$ and $B_0^1$. These different field strengths respectively result in MR signals being acquired with different SNRs, with the SNR for $B_0^1$ being highest and the SNR for $B_0^3$ being lowest, because the field strengths decrease with increasing distance from the basic field magnet.

Figure 4:
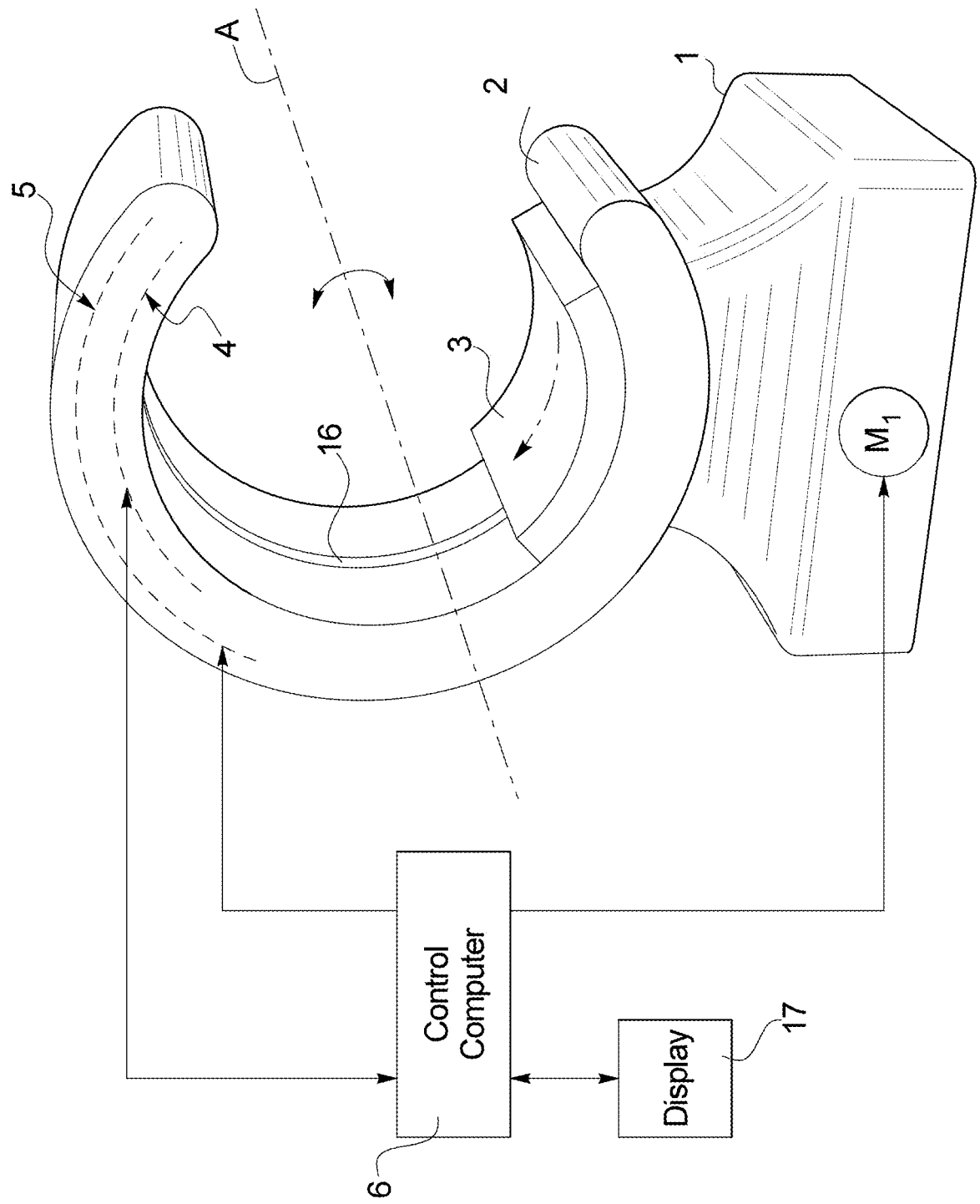
FIG. 4 is a perspective view of the MR scanner in accordance with the invention, with a block diagram of basic operating components thereof.

FIG. 4 is a perspective view of the basic components of an MR scanner according to the present invention. The MR scanner itself has a base 1, on which a C-arm 2 is mounted for rotation around a horizontal axis A. The C-arm 2 has a basic field magnet 3 mounted thereon, that is rotatable around the axis A. An RF antenna 4 and a gradient coil arrangement 5 are schematically illustrated in FIG. 4, as being embodied within the C-arm 2. Alternatively, a local RF coil (as shown in other figures) can be used, that is placed directly on the patient at the region of the patient from which MR data are to be acquired. A gradient coil arrangement that is not built into the C-arm 2 also can be used. The MR scanner alternatively can be constructed, and operated, with no gradient coil arrangement at all, as described in WO 2018/106760 A1, cited above.

Rotation of the basic field magnet 3 is implemented by a prime mover $M_1$, which is operated by a control computer 6, which also operates the RF antenna 4 and the gradient coil arrangement 5. The RF antenna 4 and the gradient coil arrangement 5 are operated by the computer 6 according to any suitable pulse sequence (protocol) for producing a series of RF pulses and gradient pulses in order to acquire MR data from a patient situated in the MR scanner.

The prime mover $M_1$ may be a motor, a pneumatic or hydraulic system, or any other suitable drive arrangement.

The basic field magnet 3 may be stationarily mounted in the C-arm 2, with the C-arm 2 being rotated around the axis A by the prime mover $M_1$. As an alternative, shown in FIG. 4, to rotating the C-arm 2 itself, the basic field magnet 3 can be moved along the C-arm 2, while the C-arm 2 remains stationary, guided by a suitable mechanical guide arrangement, such as on rails that follow the curvature of the C-arm 2. Such transport of the basic field magnet 3 along the C-arm 2 can be implemented by any suitable transport mechanism, such as by a pulley arrangement, a transport belt or pneumatic or hydraulic actuators, driven by the prime mover $M_1$. The arrow within the basic field magnet 3 shown in FIG. 4 indicates the direction of movement that will take place if the basic field magnet 3 moves along the interior of the C-arm 2.

In order to acquire an image of a patient according to the invention, the control computer 6 operates the prime mover $M_1$ so as to position the basic field magnet 3 in at least one angle position beneath the patient, as shown in FIG. 4, and then one scan of the patient is conducted in order to acquire a first set of MR data. The control computer 6 then operates the prime mover $M_1$ so as to rotate the C-arm 2 or the basic field magnet 3 through 180°, so that the basic field magnet 3 is positioned in at least one angle position above the patient. These respective angle positions above and below the patient may be 180° opposite each other, in one embodiment.

A scan of a patient situated along the axis A in the MR scanner shown in FIG. 4 thus takes place with the basic field magnet at each of the respective positions above and below the patient. An image is reconstructed from the MR data acquired in each of those scans, and the two reconstructed images are brought into registration with each other, and are combined according to any suitable combining technique, such as SoS, in order to produce a combined, final image of the patient.

The C-arm 2 shown in FIG. 4 defines a plane that is orthogonal to the axis A, and thus rotation of the C-arm 2, or movement of the basic field magnet 3 along the C-arm 2, take place in a direction that is within that plane. As is known for C-arm structures used in computed tomography, however, the C-arm 2 may also be rotatable, at least to a certain extent, out of the aforementioned plane.

The basic field magnet 3 can be moved along the interior of the C-arm 2, with the C-arm 2 being stationary, by any suitable transport and guide mechanism. In the embodiment shown in FIG. 4, the basic field magnet 3 has a projection (not shown) at the underside thereof that extends into a slot 16. Any suitable transport mechanism, such as pulleys, a transport belt, a gear arrangement pneumatic or hydraulic actuators, etc. can be used to pull and push the basic field magnet 3 along the curvature of the C-arm 2. The bottom of the basic field magnet 3 may be provided with wheels, rollers or other suitable components to facilitate movement of the basic field magnet 3 along the interior curvature of the C-arm 2. Guide rails or other alignment elements may be provided on the exterior surface of the interior curve of the C-arm 2, in order to further assist in such movement of the basic field magnet 3.

Figure 5:
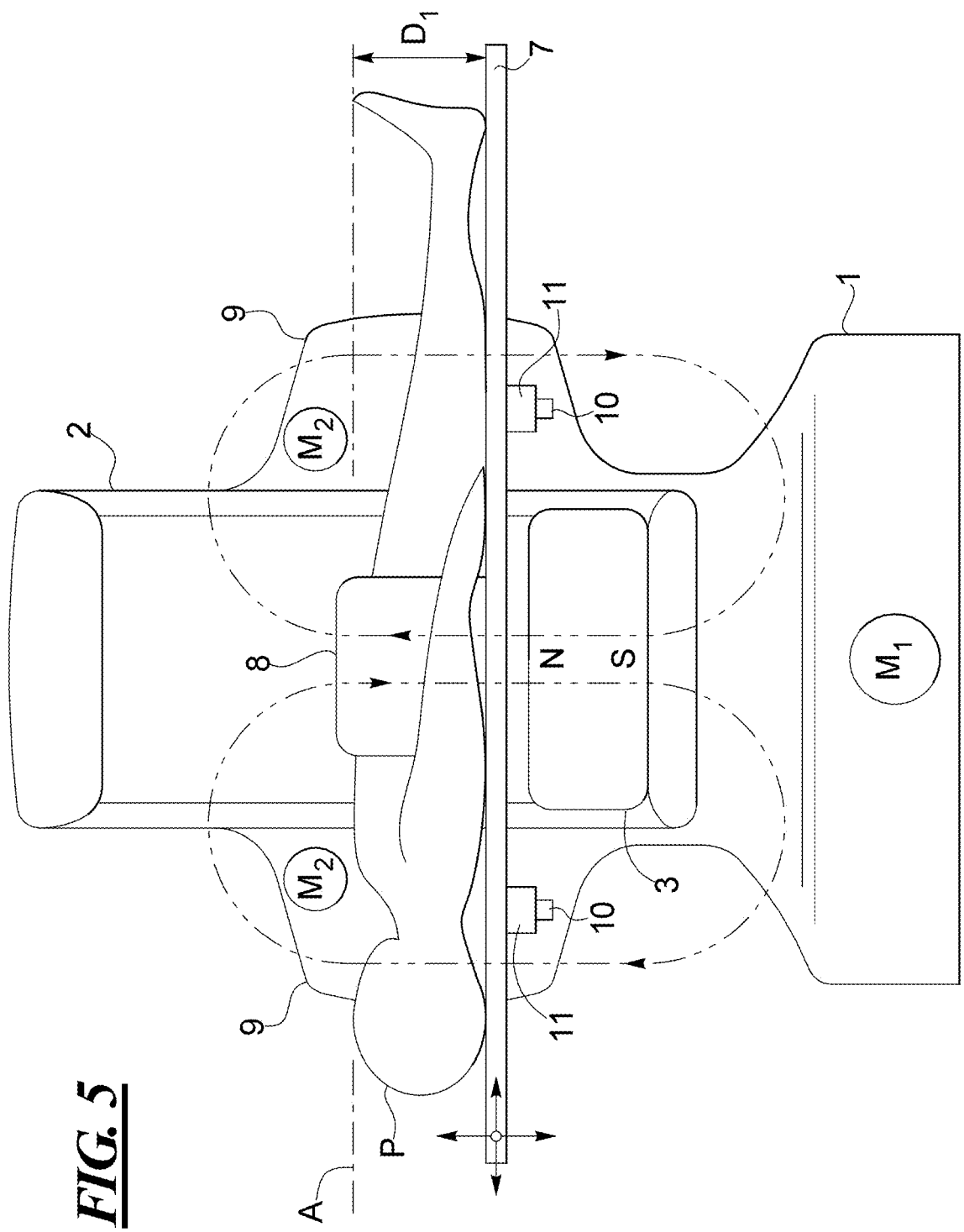
FIGS. 5 and 6 are end views of the MR scanner according to the invention, with the patient on the patient table positioned at different heights.
Figure 6:
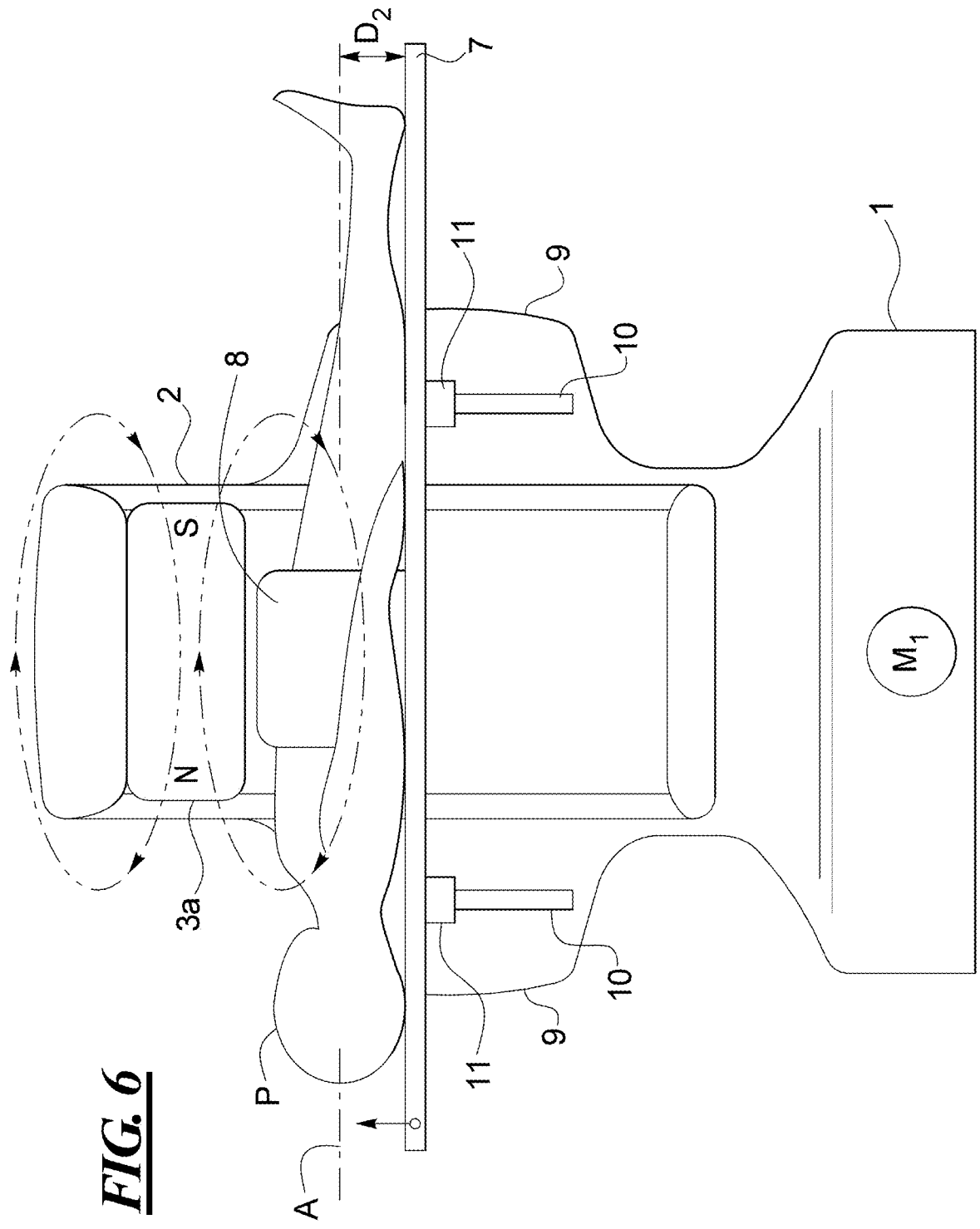

FIGS. 5 and 6 show an embodiment for adjusting the height of the patient P lying on a patient table 7. In FIG. 5, the basic field magnet 3 is shown in the position beneath the patient, with a polarity that causes the field lines to proceed generally through transverse or axial planes of the patient P. In FIG. 6 the basic field magnet is in the position above the patient P, but with a polarity that causes the field lines of the basic magnetic field to proceed generally through sagittal or median planes of the patient P. Because of the different polarity orientation of the basic field magnet shown in FIG. 6, it is provided with reference numeral 3a in FIG. 6. FIGS. 5 and 6 are provided for the purpose of showing the different types of polarities that can be used, but in practice the basic field magnet 3 will have the same polarity orientation in both positions above and below the patient P, i.e., it will have the same polarity for conducting the aforementioned two scans of the patient P at those positions.

Also in FIGS. 5 and 6, the alternative of using a local RF coil 8 is shown. In the embodiment of FIGS. 5 and 6, the local RF coil 8 is of the type for conducting an abdominal scan of the patient P, but other local RF coils can be used, as are known for acquiring MR data from other anatomical regions of the patient P.

In the embodiment shown in FIGS. 5 and 6, the C-arm 2 is provided with lateral extensions 9 that each have a slot 10 therein, in which lifters 11 are respectively vertically movable. As schematically shown in FIG. 5, the lifters 11 may be operated by separate prime movers $M_2$, but it is also possible to provide an appropriate transmission or drive train from the prime mover $M_1$, so that further prime movers are not needed.

As noted above, there is a tradeoff between maintaining a sufficient safety clearance between the patient P and the rotating C-arm 2 or basic field magnet 3, and the drop-off of the $B_0$ field away from the basic field magnet 3. As noted above, the basic magnetic field is highest (strongest) closest to the basic field magnet 3, and is minimal at the opposite boundary of the FOV.

As shown in FIGS. 5 and 6, after the C-arm 2 or the basic field magnet 3 has been rotated in order to position the basic field magnet 3 for the particular scan that is to be implemented, the height of the table 7, and thus the position of the patient P relative to the basic field magnet 3, can be set, in order to make the best use of the available field strength, so as to maximize SNR. In the position shown in FIG. 5, the table 7 is adjusted to a distance $D_1$ from the axis A, and in FIG. 6 this distance is $D_2$. These would be the optimal distances given the respective polarity orientations of the basic field magnet 3 (or 3a) shown in FIGS. 5 and 6.

Figure 7:
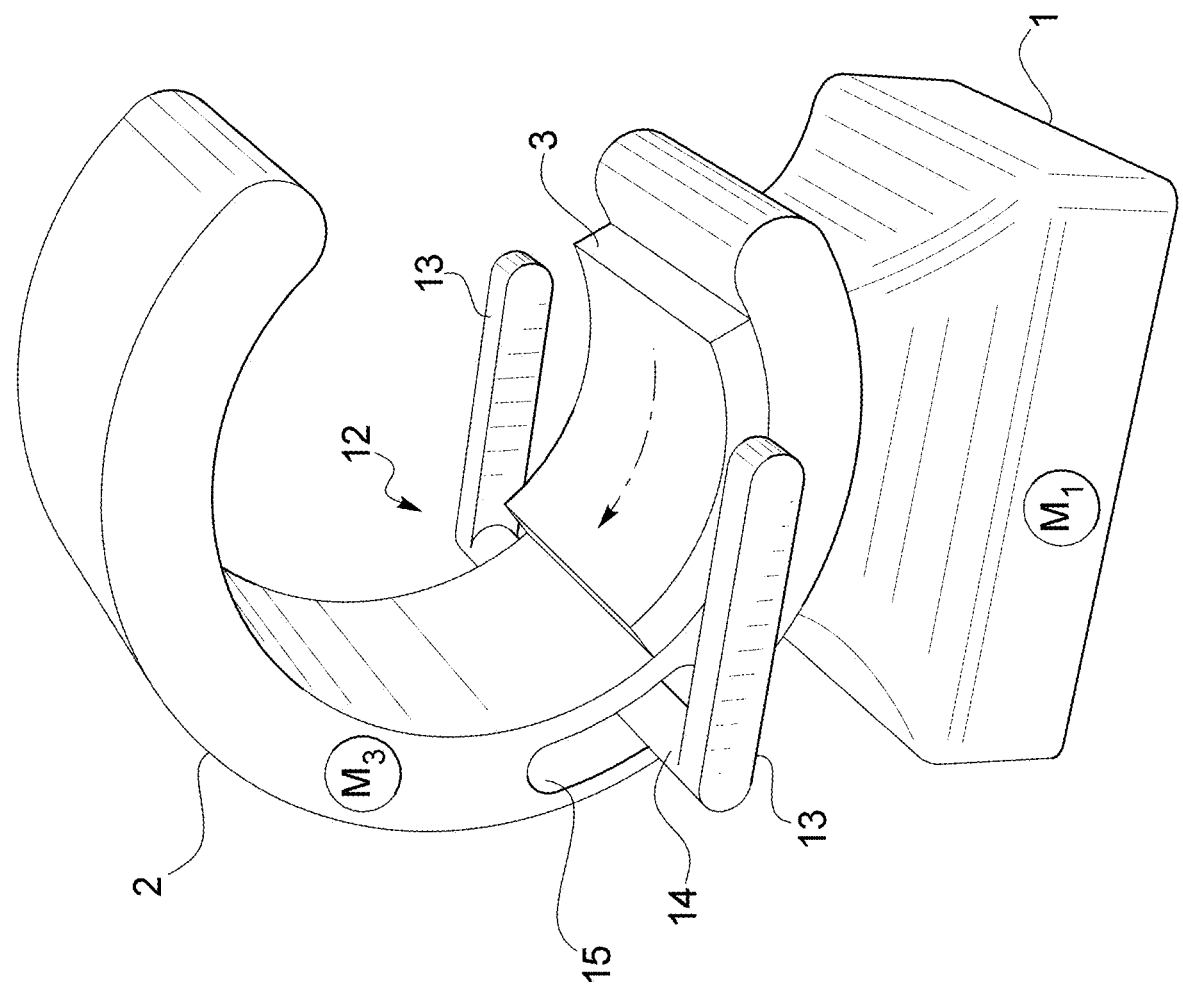
FIG. 7 is a perspective view of a further embodiment of the MR scanner according to the invention.

Another embodiment for lifting the patient table is shown in FIG. 7, wherein the patient table is not shown, for clarity. In the embodiment of FIG. 7, the patient table is lifted by a lifting assembly 12, formed by two arms 13 at opposite ends of a connector 14 that is movable within a slot 15 of the C-arm 2. This movement may be implemented by a further prime mover $M_3$, or alternatively a suitable drive train can be provided from the prime mover $M_1$, so that an additional prime mover is not necessary.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:
1. A magnetic resonance scanner comprising:
a base;
a C-arm mounted on said base, said C-arm having an inner surface curved in a C-shape, said C-shape defining a plane;
a magnet mounted on said inner curved surface of said C-arm, said magnet generating a basic magnetic field for magnetic resonance imaging; and
a drive mechanism mechanically connected to said magnet, said drive mechanism rotating said magnet around an axis that is orthogonal to said plane so as to selectively position said magnet in at least two magnet positions that are on opposite sides of said axis.

2. A magnetic resonance scanner as claimed in claim 1 wherein said magnet is a permanent magnet.

3. A magnetic resonance scanner as claimed in claim 1 wherein said magnet is an electromagnet.

4. A magnetic resonance scanner as claimed in claim 1 wherein said C-arm is rotatably mounted on said base and said magnet is stationarily mounted on said inner surface of said C-arm, and wherein said drive mechanism rotates said magnet around said axis by rotating said C-arm around said axis.

5. A magnetic resonance scanner as claimed in claim 1 wherein said magnet is movably mounted on said inner surface of said C-arm, and wherein said drive mechanism rotates said magnet around said axis by moving said magnet along said inner surface of said C-arm.

6. A magnetic resonance scanner as claimed in claim 1 comprising a lifting mechanism adapted to receive a patient table thereon, said lifting mechanism comprising a lifting mechanism drive that moves said lifting mechanism to different heights relative to said axis.

7. A magnetic resonance scanner as claimed in claim 6 wherein said drive mechanism that rotates said magnet and said lifting mechanism drive use a same prime mover that is a component of each of said drive mechanism that rotates said magnet and said lifting mechanism drive.

8. A magnetic resonance scanner as claimed in claim 6 wherein said C-arm has projections respectively on opposite sides of said plane, each of said projections having a vertical slot therein, and wherein said lifting mechanism comprises lifters that are respectively vertically movable in said vertical slots by said lifting mechanism drive.

9. A magnetic resonance scanner as claimed in claim 6 wherein said C-arm has a slot therein extending through said C-arm in a direction perpendicular to said plane, said slot having a curvature conforming to said C-shape, and wherein said lifting mechanism comprises a lifter assembly having two arms respectively on opposite sides of said C-arm, said two arms being connected by a connector that extends through said slot, said connector being movable in said slot by said lifting mechanism drive.

10. A magnetic resonance scanner as claimed in claim 1 comprising a radio-frequency antenna for said magnetic resonance imaging and a gradient coil arrangement for said magnetic resonance imaging, said radio-frequency antenna and said gradient coil arrangement being built into said C-arm.

11. A magnetic resonance apparatus comprising:
a radio-frequency antenna;
a base;
a C-arm mounted on said base, said C-arm having an inner surface curved in a C-shape, said C-shape defining a plane;
a magnet mounted on said inner curved surface of said C-arm, said magnet generating a basic magnetic field for magnetic resonance imaging;
a drive mechanism mechanically connected to said magnet, said drive mechanism rotating said magnet around an axis that is orthogonal to said plane so as to selectively position said magnet in at least two magnet positions that are respectively above and below a patient;
a patient table adapted to receive the patient thereon along or parallel to said axis;
a computer connected to said radio-frequency antenna and said drive mechanism so as to operate said radio-frequency antenna in order to at least acquire first magnetic resonance data from a patient on said table in said basic magnetic field with said magnet situated in a position beneath said table, and second magnetic resonance data from the patient in said basic magnetic field with said magnet situated in a position above said patient table; and
said computer being configured to reconstruct at least first and second images of the patient at least from said first and second magnetic resonance data, and to bring said first and second magnetic resonance images into registration with each other, and to combine the first and second magnetic resonance images with each other in order to obtain a combined magnetic resonance image of the patient, and to make the combined magnetic resonance image of the patient available from the computer in electronic form as a data file.

12. A magnetic resonance apparatus as claimed in claim 11 wherein said computer is configured to combine said first and second magnetic resonance images by a Sum-of-Squares combination technique.

13. A magnetic resonance apparatus as claimed in claim 11 wherein said radio-frequency antenna is a local coil adapted for placement on the patient.

14. A magnetic resonance apparatus as claimed in claim 11 wherein said radio-frequency antenna is built into said C-arm.

15. A magnetic resonance apparatus as claimed in claim 11 comprising a gradient coil arrangement, and wherein said computer is configured to operate the gradient coil arrangement in combination with the radio-frequency antenna and the drive mechanism so as to acquire said first and second magnetic resonance data with spatial encoding produced by said gradient coil arrangement.

16. A magnetic resonance apparatus as claimed in claim 11 wherein said computer is configured to operate said magnet in a repeated cycle between generating said basic magnetic field, and generating a magnetic field with a lower strength than said basic magnetic field, in order to spatially encode said first and second magnetic resonance data during acquisition thereof.

17. A magnetic resonance apparatus as claimed in claim 11 wherein said C-arm is rotatably mounted on said base and said magnet is stationarily mounted on said inner surface of said C-arm, and wherein said drive mechanism rotates said magnet around said axis by rotating said C-arm around said axis.

18. A magnetic resonance apparatus as claimed in claim 11 wherein said magnet is movably mounted on said inner surface of said C-arm, and wherein said drive mechanism rotates said magnet around said axis by moving said magnet along said inner surface of said C-arm.

19. A magnetic resonance apparatus as claimed in claim 11 comprising a lifting mechanism adapted to receive a patient table thereon, said lifting mechanism comprising a lifting mechanism drive that moves said lifting mechanism to different heights relative to said axis.

20. A magnetic resonance apparatus as claimed in claim 19 wherein said drive mechanism that rotates said magnet and said lifting mechanism drive use a same motor that is a component of each of said drive mechanism that rotates said magnet and said lifting mechanism drive.

21. A magnetic resonance apparatus as claimed in claim 19 wherein said C-arm has projections on opposite sides of said plane, each of said projections having a vertical slot therein, and wherein said lifting mechanism comprises lifters that are respectively vertically movable in said vertical slots by said lifting mechanism drive.

22. A magnetic resonance apparatus as claimed in claim 19 wherein said C-arm has a slot therein extending through said C-arm in a direction perpendicular to said plane, said slot having a curvature conforming to said C-shape, and wherein said lifting mechanism comprises a lifter assembly having two arms respectively on opposite sides of said C-arm, said two arms being connected by a connector that extends through said slot, said connector being movable in said slot by said lifting mechanism drive.

23. A method for operating a magnetic resonance apparatus comprising a radio-frequency antenna, a base, and a C-arm mounted on said base, said C-arm having an inner surface curved in a C-shape, said C-shape defining a plane, said method comprising:

mounting a magnet on said inner curved surface of said C-arm and, with said magnet, generating a basic magnetic field for magnetic resonance imaging;

while a patient is situated within said C-arm along or parallel to an axis that is orthogonal to said plane, operating a drive mechanism mechanically connected to said magnet, so as to rotate said magnet around said axis and thereby selectively position said magnet in at least two magnet positions that are respectively above and below the patient;

with a computer connected to said radio-frequency antenna and said drive mechanism, operating said radio-frequency antenna and said drive mechanism in combination with each other in order to acquire first magnetic resonance data from the patient in said basic magnetic field with said magnet situated beneath a patient table, and to acquire second magnetic resonance data from the patient with said magnet situated above said patient table; and in said computer, reconstructing at least first and second images of the patient at least from said first and second magnetic resonance data, and bringing said first and second magnetic resonance images into registration with each other, and combining the first and second magnetic resonance images with each other in order to obtain a combined magnetic resonance image of the patient, and making the combined magnetic resonance image of the patient available from the computer in electronic form as a data file.

24. A method as claimed in claim 23 comprising mounting aid C-arm rotatably on said base and mounting said magnet stationarily on said inner surface of said C-arm and, with said drive mechanism, rotating said magnet around said axis by rotating said C-arm around said axis.

25. A method as claimed in claim 23 comprising mounting said magnet movably on said inner surface of said C-arm and, with said drive mechanism, rotating said magnet around said axis by moving said magnet along said inner surface of said C-arm.

26. A method as claimed in claim 23 wherein said magnetic resonance apparatus comprises a gradient coil arrangement, and comprising, with said computer, operating the gradient coil arrangement in combination with the radio-frequency antenna and the drive mechanism so as to acquire said first and second magnetic resonance data with spatial encoding produced by said gradient coil arrangement.

27. A method as claimed in claim 23 comprising, with said computer, operating said magnet in a repeated cycle between generating said basic magnetic field, and generating a magnetic field with a lower strength than said basic magnetic field, in order to spatially encode said first and second magnetic resonance data during acquisition thereof.

* * * * *